United States Patent
McMullan et al.

(10) Patent No.: US 8,379,435 B2
(45) Date of Patent: Feb. 19, 2013

(54) SMART WELL ASSISTED SRAM READ AND WRITE

(75) Inventors: Russell C. McMullan, Allen, TX (US); Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 188 days.

(21) Appl. No.: 12/507,437

(22) Filed: Jul. 22, 2009

(65) Prior Publication Data

US 2011/0019464 A1  Jan. 27, 2011

(51) Int. Cl.
*G11C 11/00* (2006.01)
*G11C 7/00* (2006.01)

(52) U.S. Cl. ............... 365/156; 365/189.16; 365/154

(58) Field of Classification Search ............... 365/156, 365/154, 230.05; 257/903, E27.098, E27.099
See application file for complete search history.

(56) References Cited

U.S. PATENT DOCUMENTS

| 6,900,656 | B1 | 5/2005 | Houston et al. | |
|---|---|---|---|---|
| 7,613,031 | B2 * | 11/2009 | Hanafi et al. | 365/154 |
| 7,957,176 | B2 * | 6/2011 | Otsuka | 365/154 |
| 2009/0154259 | A1 * | 6/2009 | Voelkel | 365/189.09 |

* cited by examiner

*Primary Examiner* — Toan Le
*Assistant Examiner* — Hai Pham
(74) *Attorney, Agent, or Firm* — Rose Alyssa Keagy; Wade J. Brady, III; Frederick J. Telecky, Jr.

(57) ABSTRACT

An integrated circuit containing an array of SRAM cells with NMOS drivers and passgates, and an n-well bias control circuit which biases n-wells in each SRAM column independently. An integrated circuit containing an array of SRAM cells with PMOS drivers and passgates, and a p-well bias control circuit which biases p-wells in each SRAM column independently. A process of operating an integrated circuit containing an array of SRAM cells with NMOS drivers and passgates, and an n-well bias control circuit which biases n-wells in each SRAM column independently.

4 Claims, 7 Drawing Sheets

SMART WELL ASSISTED SRAM READ AND WRITE

FIELD OF THE INVENTION

This invention relates to the field of integrated circuits. More particularly, this invention relates to static random access memories (SRAMs) in integrated circuits.

DETAILED DESCRIPTION

Figure 1:
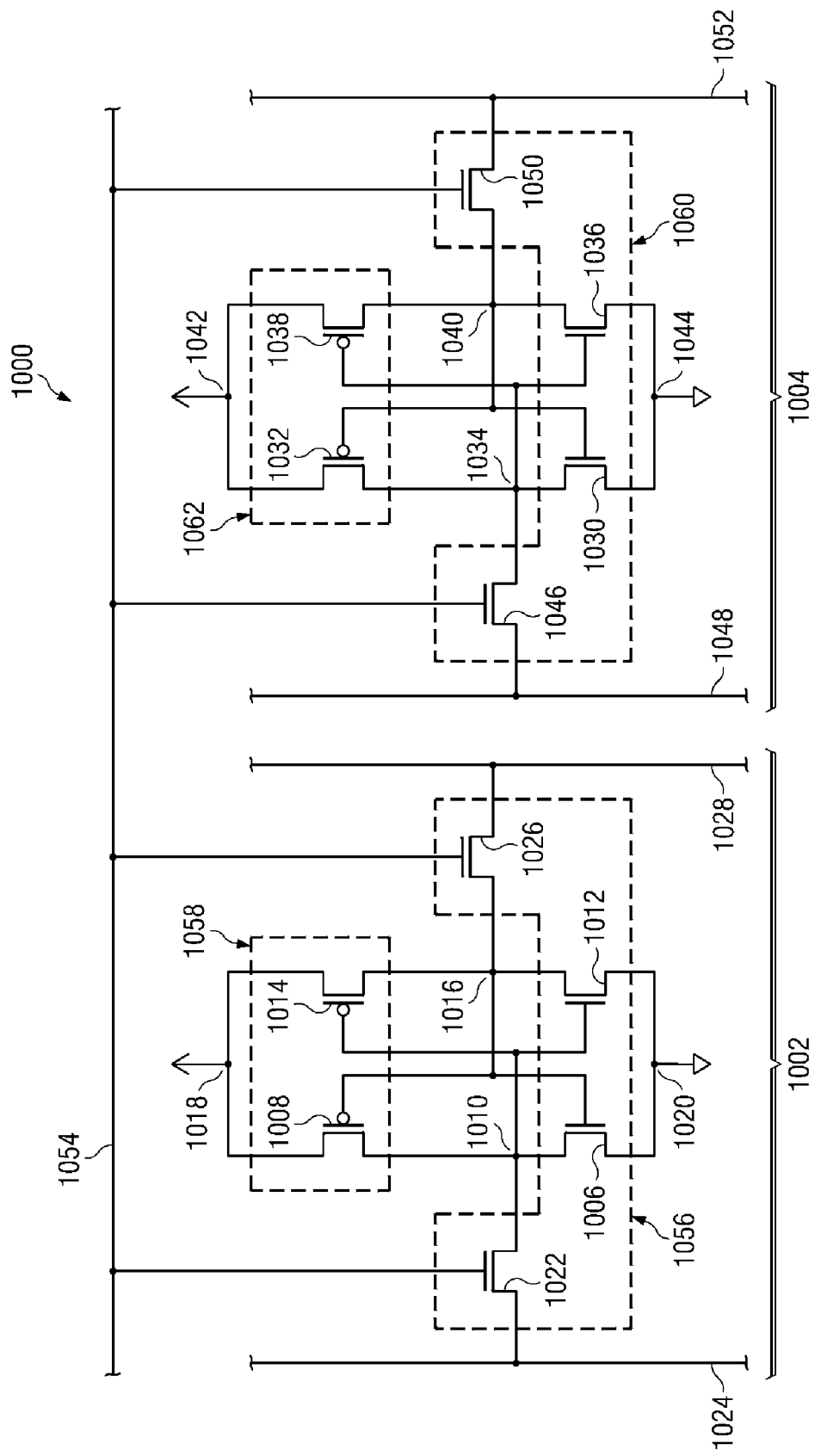
FIG. 1 is a circuit diagram of an SRAM cell array contained in an integrated circuit formed according to a first embodiment of the instant invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

For the purposes of this disclosure, the term "Vdd" is understood to refer to a power supply node with a potential suitable for source nodes of p-channel metal oxide semiconductor (PMOS) transistors. Similarly, the term "Vss" is understood to refer to a power supply node with a potential suitable for source nodes of n-channel metal oxide semiconductor (NMOS) transistors, and is lower than the Vdd potential. The term "floated" is understood to mean disconnected from a voltage source such as Vdd or Vss, or connected to a voltage source through a high impedance, for example a transistor, a resistor or a diode.

In this disclosure, the term "driver transistor" is understood to refer to a metal oxide semiconductor (MOS) transistor in an SRAM cell. A drain node of the driver transistor is connected to a data node of the SRAM cell. A gate node of the driver transistor is connected to an opposite data node of the SRAM cell from the driver drain node. A source node of the driver transistor is connected to a power supply node; typically Vdd for PMOS driver transistors or Vss for NMOS driver transistors. A polarity of the driver transistor source node power supply is opposite a polarity of a read operation pre-charge potential of a corresponding data line which is connected to the driver transistor through a passgate transistor. Therefore, SRAM cells in arrays that pre-charge data lines to a high voltage have NMOS driver transistors, while SRAM cells in arrays that pre-charge data lines to a low voltage have PMOS driver transistors.

Similarly, the term "load transistor" is understood to refer to another MOS transistor in the SRAM cell. A drain node of the load transistor is connected to a data node of the SRAM cell. A gate node of the load transistor is connected to an opposite data node of the SRAM cell from the load drain node. A source node of the load transistor is connected to a power supply node; typically Vdd for PMOS load transistors or Vss for NMOS load transistors. A polarity of the load transistor source node power supply is the same as the polarity of a read operation pre-charge potential of a corresponding data line which is connected to the driver transistor through a passgate transistor. Therefore, SRAM cells in arrays that pre-charge data lines to a high voltage have PMOS load transistors, while SRAM cells in arrays that pre-charge data lines to a low voltage have NMOS load transistors.

The term "passgate transistor" is understood to refer to yet another MOS transistor in the SRAM cell, of which one source/drain node is connected to a data node of the SRAM cell and an opposite source/drain node is connected to a corresponding data line of the SRAM cell.

For the purposes of this disclosure, the term "bit-side" is understood to refer to components such as a driver transistor, load transistor and passgate transistor connected a data node in an SRAM cell. Similarly, the term "bit-bar-side" is understood to refer to components connected to an opposite data node from the bit-side node in the SRAM cell. A bit-side data line is commonly referred to as a bit line. A bit-bar-side data line is commonly referred to as a bit-bar line. A bit-side driver transistor is commonly referred to as a bit driver; similarly a bit-bar-side driver transistor is commonly referred to as a bit-bar driver. A bit-side load transistor is commonly referred to as a bit load; similarly a bit-bar-side load transistor is commonly referred to as a bit-bar load. A bit-side passgate transistor is commonly referred to as a bit passgate; similarly a bit-bar-side passgate transistor is commonly referred to as a bit-bar passgate.

For the purposes of this disclosure, the term "addressed SRAM cell" is understood to refer to an SRAM cell in which a passgate transistor—and a second passgate transistor if present—are turned on, plus a bit line—and a bit-bar line if present—are connected to read circuitry or write circuitry. The term "half-addressed SRAM cell" is understood to refer to an SRAM cell in which a passgate transistor—and a second passgate transistor if present—are turned on, while a bit line—and a bit-bar line if present—are disconnected from read or write circuitry. A "row" of an SRAM cell array is understood to mean those cells in the SRAM array in which gates of passgate transistors are electrically connected together, typically by a word line. A "column" of an SRAM cell array is understood to mean those cells in the SRAM array in which source/drain nodes of passgate transistors are electrically connected together, typically by a bit line or a bit-bar line.

In some instances of integrated circuits containing SRAM cell arrays, substantially all circuits in the integrated circuit are dedicated to operation of the SRAM array. In these instances, circuits which provide data to be stored in the SRAM array and circuits which use data from the SRAM array are located outside the integrated circuit containing the SRAM array. In other instances of integrated circuits containing SRAM cell arrays, such as microprocessors, digital signal processors and wireless telephony controllers, circuits which provide data to be stored in the SRAM array and circuits which use data from the SRAM array are located in the integrated circuit.

The instant invention provides an integrated circuit containing an array of SRAM cells, in which one or more n-type wells, commonly known as n-wells, containing PMOS transistors in a column of the SRAM cells are configured so as to be capable of being biased independently of n-wells containing PMOS transistors in SRAM cells in other columns. During write and read operations, biases to the n-wells in columns containing addressed SRAM cells are adjusted to provide additional write and read margin, respectively. Biases to the n-wells in columns containing half-addressed SRAM cells are adjusted to provide additional margin against data upset during the write and read operations.

In further embodiments, p-type wells containing NMOS transistors in a column of the SRAM cells are configured so as to be capable of being biased independently of p-type wells containing NMOS transistors in SRAM cells in other columns. During write operations, biases to the p-wells in columns containing addressed SRAM cells are adjusted to provide additional write margin. Biases to the p-wells in columns containing half-addressed SRAM cells are adjusted to provide additional margin against data upset during the write operations. During read operations, biases to the p-wells in columns containing addressed SRAM cells may be adjusted to provide addition read margin. Biases to the p-wells in columns containing half-addressed SRAM cells may be adjusted to provide additional margin against data upset during the read operations.

In a first set of embodiments, the SRAM cells contain NMOS drivers, NMOS passgates and PMOS loads. In a second set of embodiments, the SRAM cells contain PMOS drivers, PMOS passgates and NMOS loads. Both sets of embodiments include manifestations in which the SRAM cells are configured for single side write operations, and other manifestations in which the SRAM cells are configured for double side write operations.

FIG. 1 is a circuit diagram of an SRAM cell array contained in an integrated circuit formed according to a first embodiment of the instant invention. The SRAM cell array (1000) includes a first SRAM cell (1002) and a second SRAM cell (1004). The first SRAM cell (1002) includes an NMOS first bit-side driver transistor (1006) commonly known as a first bit driver (1006) and a PMOS first bit-side load transistor (1008) commonly known as a first bit load (1008). A drain node of the first bit driver (1006) and a drain node of the first bit load (1008) are connected to a first bit-side data node (1010). The first SRAM cell (1002) also includes an NMOS first bit-bar-side driver transistor (1012) commonly known as a first bit-bar driver (1012) and a PMOS first bit-bar-side load transistor (1014) commonly known as a first bit-bar load (1014). A drain node of the first bit-bar driver (1012) and a drain node of the first bit-bar load (1014) are connected to a first bit-bar-side data node (1016). A source node of the first bit load (1008) and a source node of the first bit-bar load (1014) are connected to a first Vdd node (1018). A source node of the first bit driver (1006) and a source node of the first bit-bar driver (1012) are connected to a first Vss node (1020). A gate node of the first bit driver (1006) and a gate node of the first bit load (1008) are connected to the first bit-bar-side data node (1016). Similarly, a gate node of the first bit-bar driver (1012) and a gate node of the first bit-bar load (1014) are connected to the first bit-side data node (1010).

The first SRAM cell (1002) also includes an NMOS first bit-side passgate transistor (1022) commonly known as a first bit passgate (1022). A first source/drain node of the first bit passgate (1022) is connected to the first bit-side data node (1010) and a second source/drain node of the first passgate (1022) is connected to a first bit line (1024). In one embodiment, an average on-state current of the first passgate transistor (1022) is between 125 percent and 200 percent an average on-state current of the first bit load (1008).

The first SRAM cell (1002) may also include an optional NMOS first bit-bar-side passgate transistor (1026) commonly known as a first bit-bar passgate (1026). A first source/drain node of the first bit-bar passgate (1026) is connected to the first bit-bar-side data node (1016) and a second source/drain node of the first bit-bar passgate (1026) is connected to a first bit-bar line (1028). Some embodiments which do not include a bit-bar passgate may not have a bit-bar line. In another embodiment, an average on-state current of the first bit-bar passgate (1026) is between 125 percent and 200 percent an average on-state current of the first bit-bar load (1014).

The second SRAM cell (1004) includes an NMOS second bit-side driver transistor (1030) commonly known as a second bit driver (1030) and a PMOS second bit-side load transistor (1032) commonly known as a second bit load (1032). A drain node of the second bit driver (1030) and a drain node of the second bit load (1032) are connected to a second bit-side data node (1034). The second SRAM cell (1004) also includes an NMOS second bit-bar-side driver transistor (1036) commonly known as a second bit-bar driver (1036) and a PMOS second bit-bar-side load transistor (1038) commonly known as a second bit-bar load (1038). A drain node of the second bit-bar driver (1036) and a drain node of the second bit-bar load (1038) are connected to a second bit-bar-side data node (1040). A source node of the second bit load (1032) and a source node of the second bit-bar load (1038) are connected to a second Vdd node (1042). A source node of the second bit driver (1030) and a source node of the second bit-bar driver (1036) are connected to a second Vss node (1044). A gate node of the second bit driver (1030) and a gate node of the second bit load (1032) are connected to the second bit-bar-side data node (1040). Similarly, a gate node of the second bit-bar driver (1036) and a gate node of the second bit-bar load (1038) are connected to the second bit-side data node (1034).

The second SRAM cell (1004) also includes a second NMOS bit-side passgate transistor (1046) commonly known as a second bit passgate (1046). A first source/drain node of the second bit passgate (1046) is connected to the second bit-side data node (1034) and a second source/drain node of the first passgate (1046) is connected to a second bit line (1048). In one embodiment, an average on-state current of the first passgate transistor (1046) is between 125 percent and 200 percent an average on-state current of the second bit load (1032).

If the optional first bit-bar passgate (1026) is present, the second SRAM cell (1004) also includes a second NMOS bit-bar-side passgate transistor (1050) commonly known as a second bit-bar passgate (1050). A first source/drain node of the second bit-bar passgate (1050) is connected to the second bit-bar-side data node (1040) and a second source/drain node of the second bit-bar passgate (1050) is connected to a second bit-bar line (1052). In another embodiment, an average on-state current of the second bit-bar passgate (1050) is between 125 percent and 200 percent an average on-state current of the second bit-bar load (1038).

A gate node of the first bit passgate (1022), a gate node of the first bit-bar passgate (1026), if present, a gate node of the second bit passgate (1046), and a gate node of the second bit-bar passgate (1050), if present, are connected to a word line (1054). The first SRAM cell (1002) and the second SRAM cell (1004) are in a same row of the SRAM cell array (1000).

The first bit driver (1006), the first bit-bar driver (1012), the first bit passgate (1022) and the first bit-bar passgate (1026), if present, are contained in a first p-well (1056). The first bit load (1008) and the first bit-bar load (1014) are contained in a first n-well (1058). The second bit driver (1030), the second bit-bar driver (1036), the second bit passgate (1046) and the second bit-bar passgate (1050), if present, are contained in a second p-well (1060). The second bit load (1032) and the second bit-bar load (1038) are contained in a second n-well (1062).

In some embodiments, the first p-well (1056) may include two or more separate p-type regions which are electrically connected, and the second p-well (1060) may include two or more separate p-type regions which are electrically connected. In some embodiments, the first n-well (1058) may include two or more separate n-type regions which are electrically connected, and the second n-well (1062) may include two or more separate n-type regions which are electrically connected. The scope of the instant invention extends to such embodiments without referring explicitly to multiple n-wells or multiple p-wells in a single SRAM cell in this disclosure.

The first n-well (1058) and the second n-well (1062) are electrically isolated from a substrate of the integrated circuit containing the SRAM cell array (1000), for example by forming the SRAM cell array (1000) on a p-type layer of the substrate, or by forming the SRAM cell array (1000) on a silicon-on-insulator (SOI) substrate. The first n-well (1058) is electrically connected to n-wells in SRAM cells (not shown) in a same column with the first SRAM cell (1002). The second n-well (1062) is electrically connected to n-wells in SRAM cells (not shown) in a same column with the second SRAM cell (1004). The n-wells in the SRAM cells in the column containing the first SRAM cell (1002) are not directly electrically connected to the n-wells in the SRAM cells in the column containing the second SRAM cell (1004). Furthermore, the n-wells in the SRAM cells in the column containing the first SRAM cell (1002) can be biased independently from the n-wells in the SRAM cells in the column containing the second SRAM cell (1004).

In a further embodiment, the first p-well (1056) and the second p-well (1060) are electrically isolated from the substrate of the integrated circuit containing the SRAM cell array (1000), for example by forming one or more deep n-wells (not shown) under the first p-well (1056) and the second p-well (1060), or by forming the SRAM cell array (1000) on a silicon-on-insulator (SOI) substrate. The first p-well (1056) is electrically connected to p-wells in SRAM cells (not shown) in the same column with the first SRAM cell (1002). The second p-well (1060) is electrically connected to p-wells in SRAM cells (not shown) in the same column with the second SRAM cell (1004). The p-wells in the SRAM cells in the column containing the first SRAM cell (1002) are not directly electrically connected to the p-wells in the SRAM cells in the column containing the second SRAM cell (1004). Furthermore, the p-wells in the SRAM cells in the column containing the first SRAM cell (1002) can be biased independently from the p-wells in the SRAM cells in the column containing the second SRAM cell (1004).

Figure 2A:
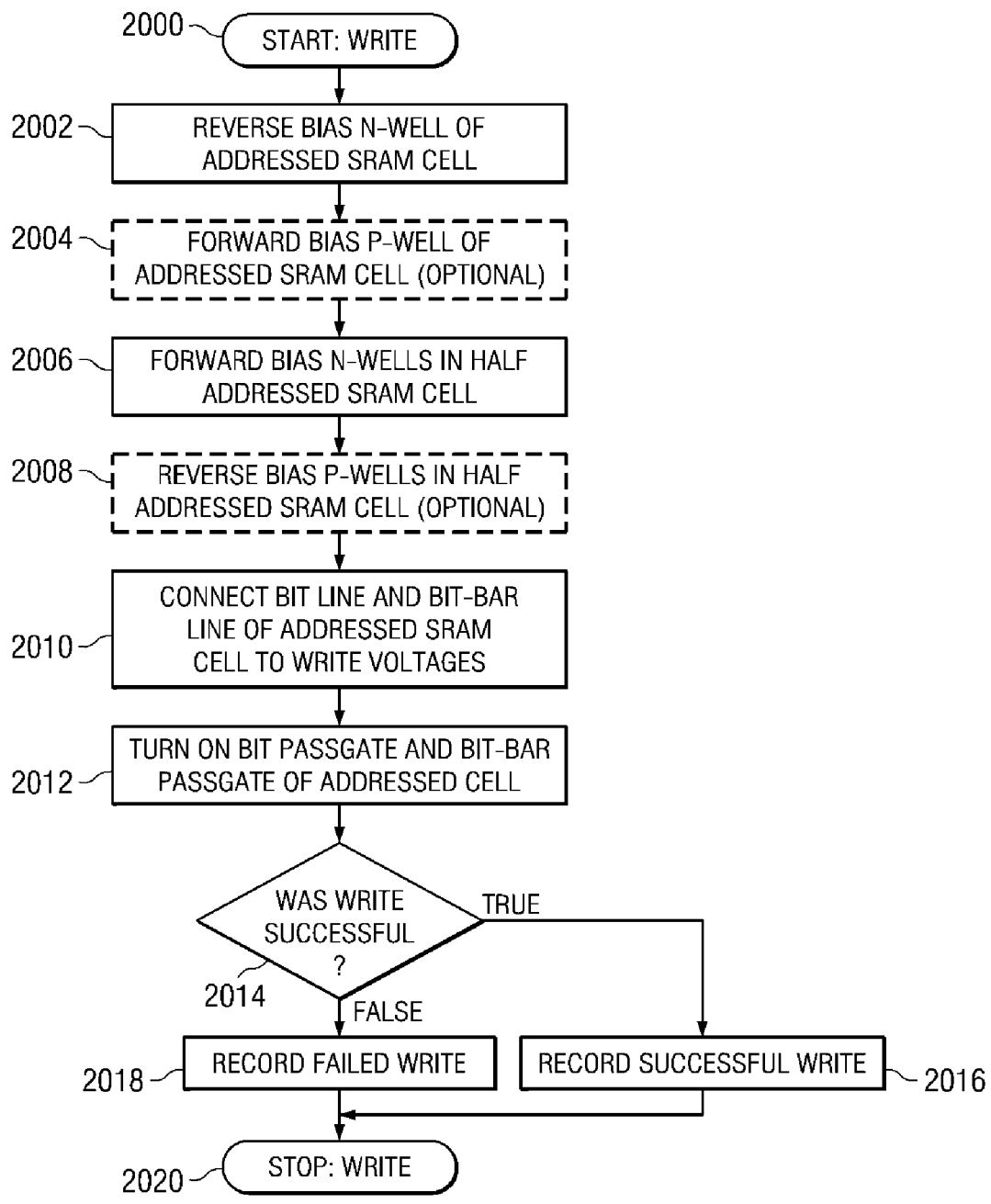
FIG. 2A and FIG. 2B are flowcharts of a write operation and a read operation, respectively. The flowcharts in FIG. 2A and FIG. 2B refer to an SRAM cell array as depicted in FIG. 1.
Figure 2B:
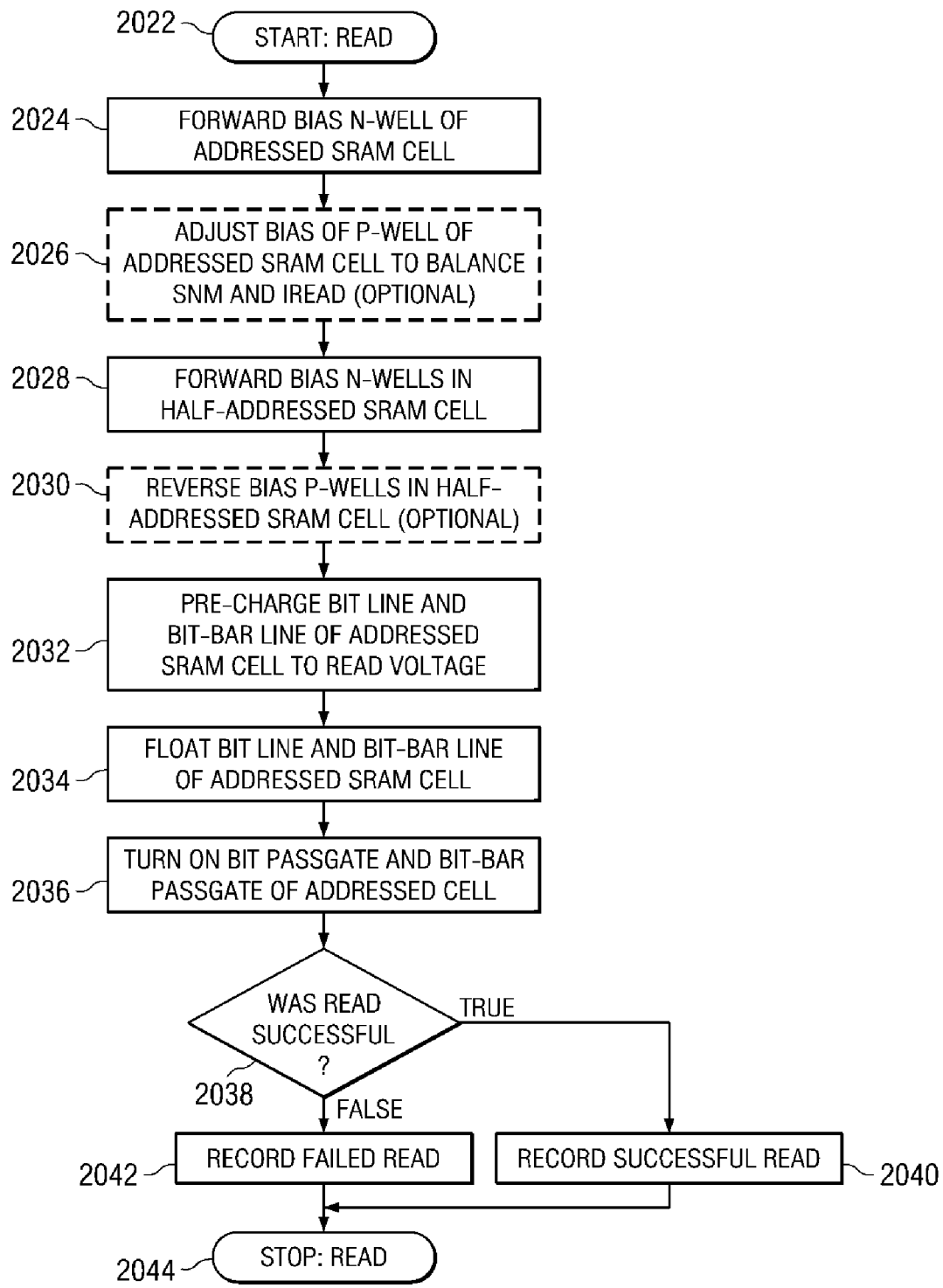

FIG. 2A and FIG. 2B are flowcharts of a write operation and a read operation, respectively. The flowcharts in FIG. 2A and FIG. 2B refer to an SRAM cell array as depicted in FIG. 1. Referring to FIG. 2A, the write operation begins (2000) with step (2002) which is to increase, by a positive voltage increment, a potential applied to an n-well containing a bit load and a bit-bar load of an addressed SRAM cell (such as the first SRAM cell 1002 of FIG. 1). Increasing a potential applied to an n-well containing a PMOS transistor may reduce an on-state current of the PMOS transistor.

Following execution of step (2002), step (2004) may be executed, which is to optionally increase, by a positive voltage increment, a potential applied to a p-well containing a bit driver, a bit-bar driver, a bit passgate and an optional bit-bar passgate, if present, of the addressed SRAM cell. Increasing a potential applied to a p-well containing an NMOS transistor may increase an on-state current of the NMOS transistor. The same effect may be achieved by decreasing, by a negative voltage increment, a potential applied to a source node of the NMOS transistor. In context of step (2004), a negative voltage increment may be applied to a Vss node of the addressed SRAM cell.

Subsequently, step (2006) is executed, which is to reduce, by applying a negative voltage increment, a potential applied to an n-well containing a bit load and a bit-bar load of a half-addressed SRAM cell (such as the second SRAM cell 1004 of FIG. 1). Reducing a potential applied to an n-well containing a PMOS transistor may increase an on-state current of the PMOS transistor.

Following execution of step (2006), step (2008) may be executed, which is to optionally reduce, by a applying negative voltage increment, a potential applied to a p-well containing a bit driver, a bit-bar driver, a bit passgate and an optional bit-bar passgate, if present, of the half-addressed SRAM cell. Reducing a potential applied to a p-well containing an NMOS transistor may reduce an on-state current of the NMOS transistor. The same effect may be achieved by increasing, by a positive voltage increment, a potential applied to a source node of the NMOS transistor. In context of step (2008), a positive voltage increment may be applied to a Vss node of the half-addressed SRAM cell.

Subsequently, step (2010) is executed, which is to connect a bit line of the addressed SRAM cell to a bit-side write potential appropriate for a data value being written into the addressed SRAM cell. In embodiments which include a bit-bar passgate, step (2010) also includes connecting a bit-bar line to a bit-bar-side write potential appropriate for a data value being written into the addressed SRAM cell. Commonly, the bit-side write potential will be a high voltage or a low voltage, while the bit-bar-side write potential will be the opposite voltage, that is, a low voltage or a high voltage, respectively.

Following execution of step (2010), step (2012) is executed, which is to turn on the bit passgate and the bit-bar passgate, if present, in the addressed SRAM cell by applying an appropriate potential to a word line connected to gate nodes of the passgate transistors in the addressed SRAM cell.

In embodiments of the write operation which are part of test operations, following execution of step (2012), step (2014) is executed, which is to determine if the bit-side write potential was successfully transferred to a bit-side data node and if there was a data upset in the half-addressed SRAM cell. If the bit-side write potential was successfully transferred and there was no data upset, step (2016) is executed, which is to record a successful write operation for the addressed SRAM cell. If the bit-side write potential was not successfully transferred or there was a data upset, step (2018) is executed, which is to record a failed write operation for the addressed SRAM cell. After step (2016) or step (2018) is executed, or after step (2012) is executed in embodiments which are not part of test operations, the write operation is ended (2020). In an alternate embodiment, steps (2002), (2004), (2006), (2008) and (2010) may be performed in any order.

Applying the positive voltage increment to the n-well in the addressed SRAM cell decreases the ratios of on state currents of the load transistors to on state currents of the passgate transistors in the addressed SRAM cell, and thereby may reduce write failures by increasing a transfer function of the bit-side write potential on the bit data line to the bit-side data node. Write failures are write operations in which potentials on bit data lines are not successfully transferred to the bit-side data nodes and stabilized.

Optionally applying the positive voltage increment to the p-well in the addressed SRAM cell further decreases the ratios of on state currents of the load transistors to on state currents of the passgate transistors in the addressed SRAM cell, thereby possibly reducing write failures.

Applying the negative voltage increment to the n-well in the half-addressed SRAM cell desirably decreases the ratios of on state currents of the load transistors to on state currents of driver transistors in the half-addressed SRAM cell, which may reduce data upsets in the half addressed SRAM cell. Data upsets are events in which the data values stored in the half-addressed SRAM cells become inverted, for example a "1" value is changed to a "0" value and vice versa.

Optionally applying the negative voltage increment to the p-well in the half-addressed SRAM cell further decreases the ratios of on state currents of the passgate transistors to on state currents of load transistors in the half-addressed SRAM cell, thereby possibly reducing data upsets.

Referring to FIG. 2B, the read operation begins (2022) with step (2024) which is to apply a negative voltage increment to the n-well in the addressed SRAM cell (such as the first SRAM cell 1002 of FIG. 1). Following execution of step (2024), step (2026) may be executed, which is to optionally adjust—with either a positive or a negative voltage increment—a bias potential applied to the p-well in the addressed SRAM cell. The bias potential is adjusted to provide a desired balance between read current and data stability in the addressed SRAM cell. Subsequently, step (2028) is executed, which is to forward bias the n-well in the half-addressed SRAM cell (such as the second SRAM cell 1004 of FIG. 1). Following execution of step (2028), step (2030) may be executed, which is to optionally bias (i.e. apply) a negative voltage increment to the p-well in the half-addressed SRAM cell. Subsequently, step (2032) is executed, which is to precharge the bit line and the bit-bar line, if present, of the addressed SRAM cell to appropriate potentials for the read circuitry of the SRAM cell array. Following execution of step (2032), step (2034) is executed, which is to float the bit line and the bit-bar line, if present, of the addressed SRAM cell. Following execution of step (2034), step (2036) is executed, which is to turn on the bit passgate transistor and the bit-bar passgate transistor, if present, in the addressed SRAM cell by applying an appropriate potential to the word line connected to the gate nodes of the passgate transistors in the addressed SRAM cell.

In embodiments of the read operation which are part of test operations, following execution of step (2036), step (2038) is executed, which is to determine if a potential on the bit-side data node and a corresponding opposite potential on the bit-bar side data node were successfully transferred to the bit data line and the bit-bar data line, if present, of the addressed SRAM cell, respectively, and to determine if a data upset occurred in the half-addressed SRAM cell. If the potentials were successfully transferred and no data upset occurred, step (2040) is executed, which is to record a successful read operation for the addressed SRAM cell. If the potentials were not successfully transferred or a data upset occurred, step (2042) is executed, which is to record a failed read operation for the addressed SRAM cell. After step (2040) or step (2042) is executed, or after step (2036) is executed in embodiments which are not part of test operations, the read operation is ended (2044). In other embodiments of the read operation, steps (2024), (2026), (2028), (2030) and (2032) may be performed in any order.

Applying the negative voltage increment to the n-well in the addressed SRAM cell increases the ratios of on state currents of the driver transistors to on state currents of the load transistors in the addressed SRAM cell, and thereby may reduce data upsets.

Applying the negative voltage increment to the n-well in the half-addressed SRAM cell advantageously may reduce data upsets in the half addressed SRAM cell, as described in reference to FIG. 2A. Optionally applying the negative voltage increment to the p-well in the half-addressed SRAM cell may further reduce data upsets, as described in reference to FIG. 2A.

Figure 3:
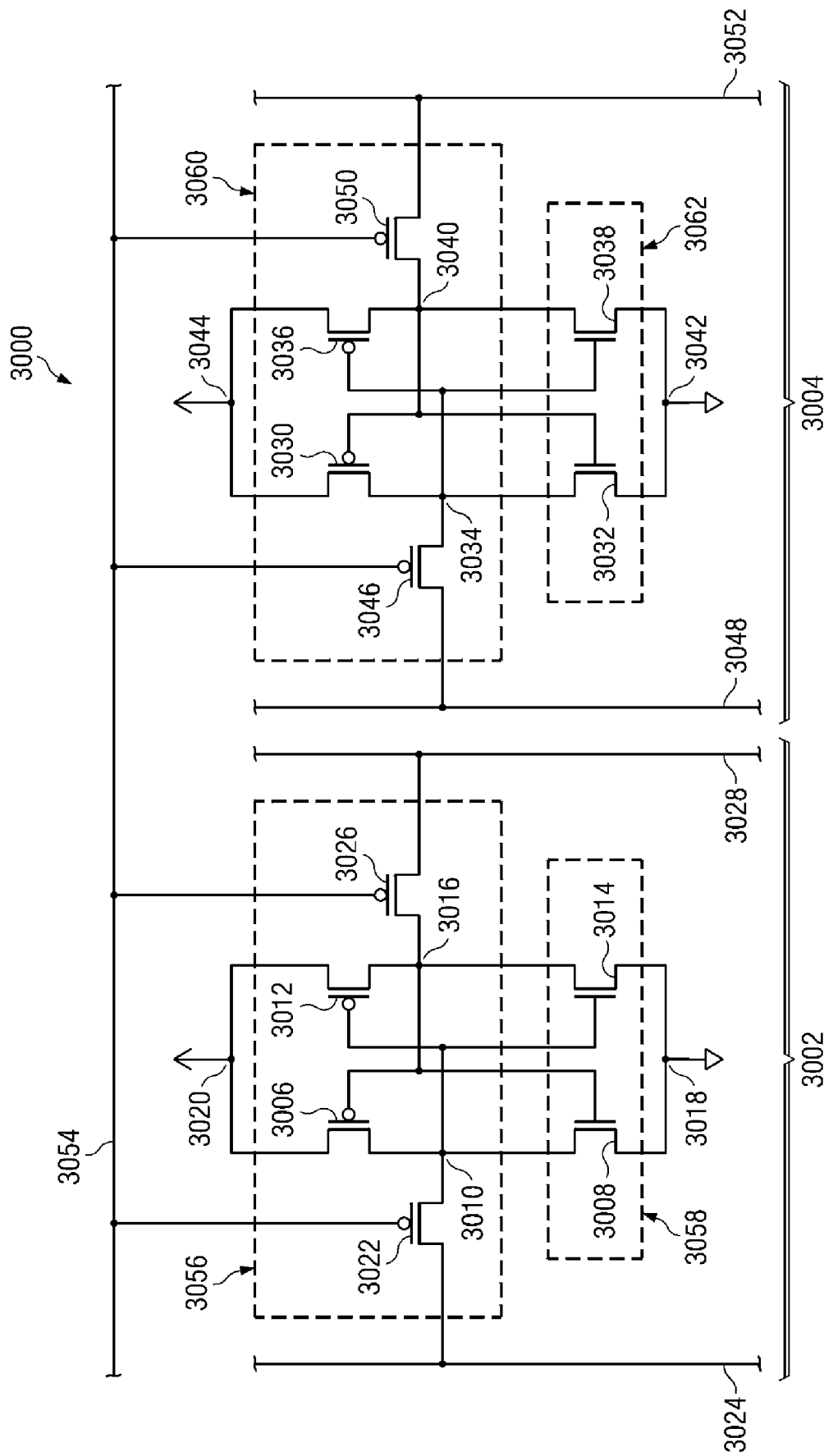
FIG. 3 is a circuit diagram of an SRAM cell array contained in an integrated circuit formed according to a second embodiment of the instant invention.

FIG. 3 is a circuit diagram of an SRAM cell array contained in an integrated circuit formed according to a second embodiment of the instant invention. The SRAM cell array (3000) includes a first SRAM cell (3002) and a second SRAM cell (3004). The first SRAM cell (3002) includes a PMOS first bit-side driver transistor (3006) commonly known as a first bit driver (3006) and an NMOS first bit-side load transistor (3008) commonly known as a first bit load (3008). A drain node of the first bit driver (3006) and a drain node of the first bit load (3008) are connected to a first bit-side data node (3010). The first SRAM cell (3002) also includes a PMOS first bit-bar-side driver transistor (3012) commonly known as a first bit-bar driver (3012) and an NMOS first bit-bar-side load transistor (3014) commonly known as a first bit-bar load (3014). A drain node of the first bit-bar driver (3012) and a drain node of the first bit-bar load (3014) are connected to a first bit-bar-side data node (3016). A source node of the first bit load (3008) and a source node of the first bit-bar load (3014) are connected to a first Vss node (3018). A source node of the first bit driver (3006) and a source node of the first bit-bar driver (3012) are connected to a first Vdd node (3020). A gate node of the first bit driver (3006) and a gate node of the first bit load (3008) are connected to the first bit-bar-side data node (3016). Similarly, a gate node of the first bit-bar driver (3012) and a gate node of the first bit-bar load (3014) are connected to the first bit-side data node (3010).

The first SRAM cell (3002) also includes a PMOS first bit-side passgate transistor (3022) commonly known as a first bit passgate (3022). A first source/drain node of the first bit passgate (3022) is connected to the first bit-side data node (3010) and a second source/drain node of the first passgate (3022) is connected to a first bit line (3024). In one embodiment, an average on-state current of the first passgate transistor (3022) is between 125 percent and 200 percent an average on-state current of the first bit load (3008).

The first SRAM cell (3002) may also include an optional PMOS first bit-bar-side passgate transistor (3026) commonly known as a first bit-bar passgate (3026). A first source/drain node of the first bit-bar passgate (3026) is connected to the first bit-bar-side data node (3016) and a second source/drain node of the first bit-bar passgate (3026) is connected to a first bit-bar line (3028). Some embodiments which do not include a bit-bar passgate may not have a bit-bar line. In another embodiment, an average on-state current of the first bit-bar passgate (3026) is between 125 percent and 200 percent an average on-state current of the first bit-bar load (3014).

The second SRAM cell (3004) includes a PMOS second bit-side driver transistor (3030) commonly known as a second bit driver (3030) and an NMOS second bit-side load transistor (3032) commonly known as a second bit load (3032). A drain node of the second bit driver (3030) and a drain node of the second bit load (3032) are connected to a second bit-side data node (3034). The second SRAM cell (3004) also includes a PMOS second bit-bar-side driver transistor (3036) commonly known as a second bit-bar driver (3036) and an NMOS second bit-bar-side load transistor (3038) commonly known as a second bit-bar load (3038). A drain node of the second bit-bar driver (3036) and a drain node of the second bit-bar load (3038) are connected to a second bit-bar-side data node (3040). A source node of the second bit load (3032) and a source node of the second bit-bar load (3038) are connected to a second Vss node (3042). A source node of the second bit driver (3030) and a source node of the second bit-bar driver (3036) are connected to a second Vdd node (3044). A gate node of the second bit driver (3030) and a gate node of the second bit load (3032) are connected to the second bit-bar-side data node (3040). Similarly, a gate node of the second bit-bar driver (3036) and a gate node of the second bit-bar load (3038) are connected to the second bit-side data node (3034).

The second SRAM cell (3004) also includes a second PMOS bit-side passgate transistor (3046) commonly known as a second bit passgate (3046). A first source/drain node of the second bit passgate (3046) is connected to the second bit-side data node (3034) and a second source/drain node of the first passgate (3046) is connected to a second bit line (3048). In one embodiment, an average on-state current of the first passgate transistor (3046) is between 125 percent and 200 percent an average on-state current of the second bit load (3032).

If the optional first bit-bar passgate (3026) is present, the second SRAM cell (3004) also includes a second PMOS bit-bar-side passgate transistor (3050) commonly known as a second bit-bar passgate (3050). A first source/drain node of the second bit-bar passgate (3050) is connected to the second bit-bar-side data node (3040) and a second source/drain node of the second bit-bar passgate (3050) is connected to a second bit-bar line (3052). In another embodiment, an average on-state current of the second bit-bar passgate (3050) is between 125 percent and 200 percent an average on-state current of the second bit-bar load (3038).

A gate node of the first bit passgate (3022), a gate node of the first bit-bar passgate (3026), if present, a gate node of the second bit passgate (3046), and a gate node of the second bit-bar passgate (3050), if present, are connected to a word line (3054). The first SRAM cell (3002) and the second SRAM cell (3004) are in a same row of the SRAM cell array (3000).

The first bit driver (3006), the first bit-bar driver (3012), the first bit passgate (3022) and the first bit-bar passgate (3026), if present, are contained in a first n-well (3056). The first bit load (3008) and the first bit-bar load (3014) are contained in a first p-well (3058). The second bit driver (3030), the second bit-bar driver (3036), the second bit passgate (3046) and the second bit-bar passgate (3050), if present, are contained in a second n-well (3060). The second bit load (3032) and the second bit-bar load (3038) are contained in a second p-well (3062).

In some embodiments, the first n-well (3056) may include two or more separate n-type regions which are electrically connected, and the second n-well (3060) may include two or more separate n-type regions which are electrically connected. In some embodiments, the first p-well (3058) may include two or more separate p-type regions which are electrically connected, and the second p-well (3062) may include two or more separate p-type regions which are electrically connected. The scope of the instant invention extends to such embodiments without referring explicitly to multiple n-wells or multiple p-wells in a single SRAM cell in this disclosure.

The first n-well (3056) and the second n-well (3060) are electrically isolated from a substrate of the integrated circuit containing the SRAM cell array (3000), for example by forming the SRAM cell array (3000) on a p-type layer of the substrate, or by forming the SRAM cell array (3000) on a silicon-on-insulator (SOI) substrate. The first n-well (3056) is electrically connected to n-wells in SRAM cells (not shown) in a same column with the first SRAM cell (3002). The second n-well (3060) is electrically connected to n-wells in SRAM cells (not shown) in a same column with the second SRAM cell (3004). The n-wells in the SRAM cells in the column containing the first SRAM cell (3002) are not directly electrically connected to the n-wells in the SRAM cells in the column containing the second SRAM cell (3004). Furthermore, the n-wells in the SRAM cells in the column containing the first SRAM cell (3002) can be biased independently from the n-wells in the SRAM cells in the column containing the second SRAM cell (3004).

In a further embodiment, the first p-well (3058) and the second p-well (3062) are electrically isolated from the substrate of the integrated circuit containing the SRAM cell array (3000), for example by forming one or more deep n-wells (not shown) under the first p-well (3058) and the second p-well (3062), or by forming the SRAM cell array (3000) on a silicon-on-insulator (SOI) substrate. The first p-well (3058) is electrically connected to p-wells in SRAM cells (not shown) in the same column with the first SRAM cell (3002). The second p-well (3062) is electrically connected to p-wells in SRAM cells (not shown) in the same column with the second SRAM cell (3004). The p-wells in the SRAM cells in the column containing the first SRAM cell (3002) are not directly electrically connected to the p-wells in the SRAM cells in the column containing the second SRAM cell (3004). Furthermore, the p-wells in the SRAM cells in the column containing the first SRAM cell (3002) can be biased independently from the p-wells in the SRAM cells in the column containing the second SRAM cell (3004).

Figure 4A:
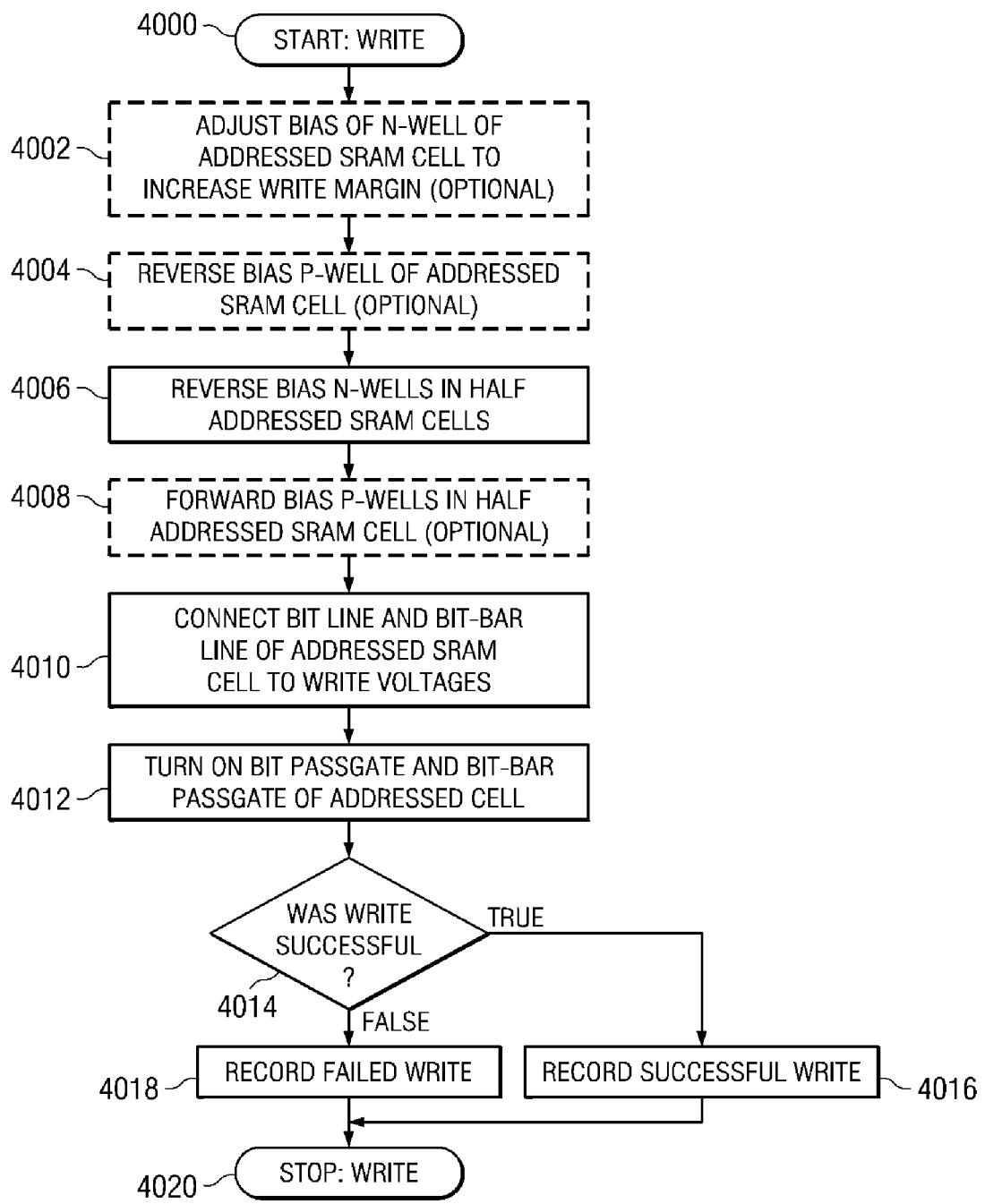
FIG. 4A and FIG. 4B are flowcharts of a write operation and a read operation, respectively. The flowcharts in FIG. 4A and FIG. 4B refer to an SRAM cell array as depicted in FIG. 2.
Figure 4B:
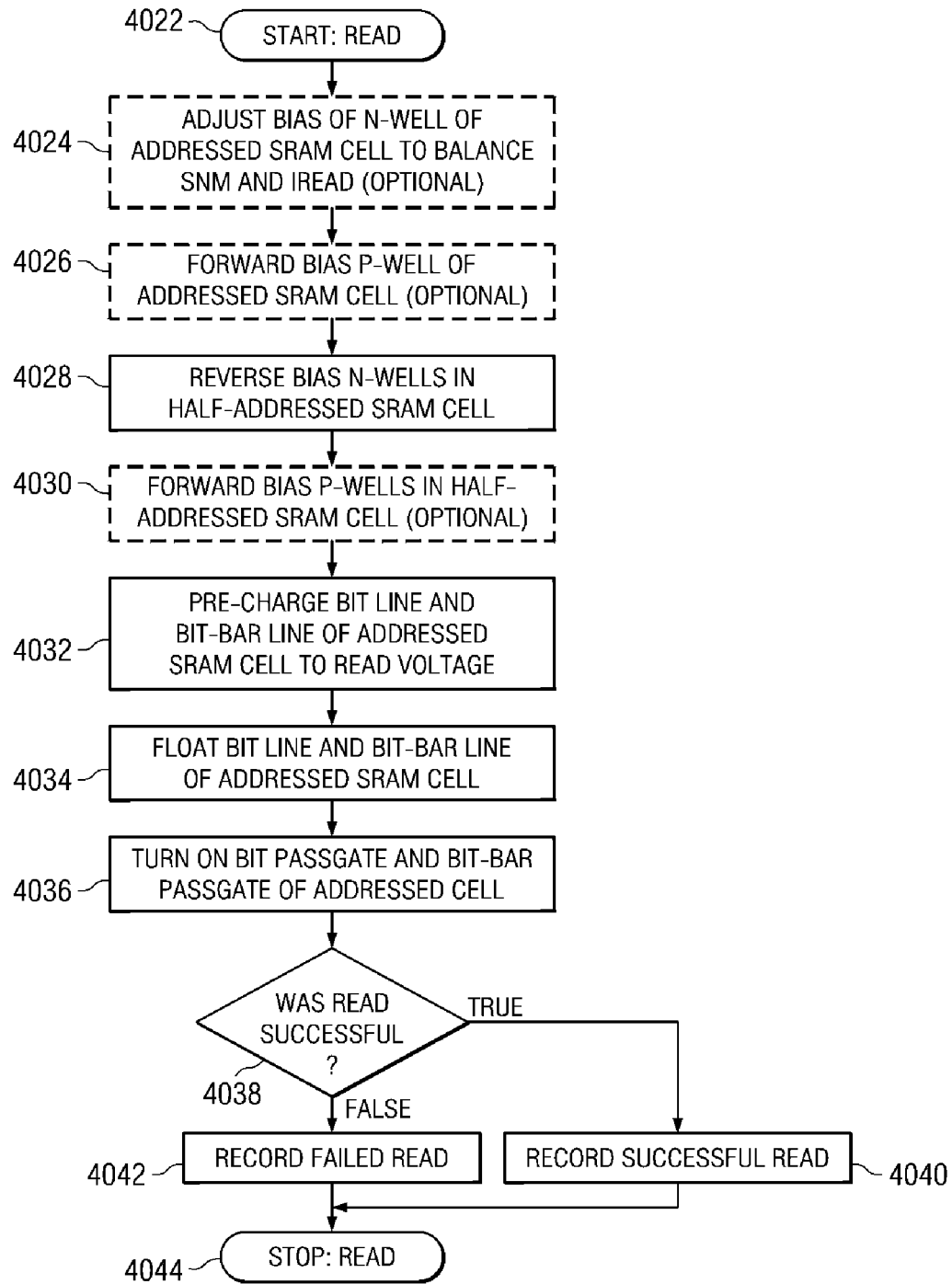

FIG. 4A and FIG. 4B are flowcharts of a write operation and a read operation, respectively. The flowcharts in FIG. 4A and FIG. 4B refer to an SRAM cell array as depicted in FIG. 3. Referring to FIG. 4A, the write operation begins (4000) with step (4002) which is to optionally adjust, by a positive or negative voltage increment, a potential applied to an n-well containing a bit driver, a bit-bar driver, a bit passgate, and a bit-bar passgate, if present, of an addressed SRAM cell (such as the first SRAM cell (3002) of FIG. 3), to possibly increase the reliability of the write operation. Following execution of step (4002), step (4004) may be executed, which is to optionally apply a negative voltage increment to a p-well containing a bit load and a bit-bar load of the addressed SRAM cell. Subsequently, step (4006) is executed, which is to bias (i.e. apply) a positive voltage increment to an n-well containing a bit load and a bit-bar load of a half-addressed SRAM cell (such as the second SRAM cell (3004) of FIG. 3). Following execution of step (4006), step (4008) may be executed, which is to optionally apply a positive voltage increment to a p-well in the half-addressed cell. Subsequently, step (4010) is executed, which is to connect a bit line of the addressed SRAM cell to a bit-side write potential appropriate for a data value being written into the addressed SRAM cell. In embodiments which include a bit-bar passgate, step (4010) also includes connecting a bit-bar line to a bit-bar-side write potential appropriate for a data value being written into the addressed SRAM cell. Commonly, the bit-side write potential will be a high voltage or a low voltage, while the bit-bar-side write potential will be the opposite voltage, that is, a low voltage or a high voltage, respectively. Following execution of step (4010), step (4012) is executed, which is to turn on the bit passgate and the bit-bar passgate, if present, in the addressed SRAM cell by applying an appropriate potential to a word line connected to the gate nodes of the passgate transistors in the addressed SRAM cell.

In embodiments of the write operation which are part of test operations, following execution of step (4012), step (4014) is executed, which is to determine if the bit-side write potential was successfully transferred to a bit-side data node of the addressed SRAM cell and if a data upset occurred in the half-addressed SRAM cell. If the bit-side write potential was successfully transferred and if no data upset occurred, step (4016) is executed, which is to record a successful write operation for the addressed SRAM cell. If the bit-side write potential was not successfully transferred or if a data upset occurred, step (4018) is executed, which is to record a failed write operation for the addressed SRAM cell. After step (4016) or step (4018) is executed, or after step (4012) is executed in embodiments which are not part of test operations, the write operation is ended (4020). In an alternate embodiment, steps (4002), (4004), (4006), (4008) and (4010) may be performed in any order.

Optionally applying the negative voltage increment to the p-well in the addressed SRAM cell decreases the ratios of on state currents of the load transistors to on state currents of the passgate transistors in the addressed SRAM cell, thereby possibly reducing write failures.

Applying the positive voltage increment to the n-well in the half-addressed SRAM cell desirably decreases the ratios of on state currents of the load transistors to on state currents of driver transistors in half-addressed SRAM cell, which may reduce data upsets in the half addressed SRAM cell.

Optionally applying the positive voltage increment to the p-well in the half-addressed SRAM cell further decreases the ratios of on state currents of the load transistors to on state currents of the driver transistors in half-addressed SRAM cell, thereby possibly reducing data upsets.

Referring to FIG. 4B, the read operation begins (4022) with step (4024) which is to optionally adjust, with either a positive or a negative voltage increment, a bias potential applied to the n-well in the addressed SRAM cell (such as the first SRAM cell (3002) of FIG. 3) to provide a desired balance between read current and data stability in the addressed SRAM cell. Subsequently, step (4026) may be executed, which is to optionally apply a positive voltage increment to the p-well in the addressed SRAM cell. Subsequently, step (4028) is executed, which is to apply a positive voltage increment to the n-well in the half-addressed SRAM cell. Following execution of step (4028), step (4030) may be executed, which is to optionally bias (i.e. apply) a positive voltage increment to the p-well in the half-addressed SRAM cell (such as the second SRAM cell (3004) of FIG. 3). Subsequently, step (4032) is executed, which is to pre-charge the bit line and the bit-bar line, if present, of the addressed SRAM cell to appropriate potentials for the read circuitry of the SRAM cell array. Following execution of step (4032), step (4034) is executed, which is to float the bit line and the bit-bar line, if present, of the addressed SRAM cell. Following execution of step (4034), step (4036) is executed, which is to turn on the bit passgate and the bit-bar passgate, if present, in the addressed SRAM cell by applying an appropriate potential to the word line connected to the gate nodes of the passgate transistors in the addressed SRAM cell.

In embodiments of the read operation which are part of test operations, following execution of step (4036), step (4038) is executed, which is to determine if a potential on the bit-side data node and a corresponding opposite potential on the bit-bar side data node were successfully transferred to the bit data line and the bit-bar data line, if present, of the addressed SRAM cell, respectively, and to determine if a data upset occurred in the half-addressed SRAM cell. If the potentials were successfully transferred and no data upset occurred, step (4040) is executed, which is to record a successful read operation for the addressed SRAM cell. If the potentials were not successfully transferred or a data upset occurred, step (4042) is executed, which is to record a failed read operation for the addressed SRAM cell. After step (4040) or step (4042) is executed, or after step (4036) is executed in embodiments which are not part of test operations, the read operation is ended (4044). In other embodiments of the read operation, steps (4024), (4026), (4028), (4030) and (4032) may be performed in any order.

Optionally applying the positive voltage increment to the p-well in the addressed SRAM cell increases the ratios of on state currents of the driver transistors to on state currents of the load transistors in the addressed SRAM cell, and thereby may reduce data upsets.

Applying the positive voltage increment to the n-well in the half-addressed SRAM cell may reduce data upsets in the half addressed SRAM cell, as described in reference to FIG. 4A. Optionally applying the positive voltage increment to the p-well in the half-addressed SRAM cell may further reduce data upsets, as described in reference to FIG. 4A.

Figure 5:
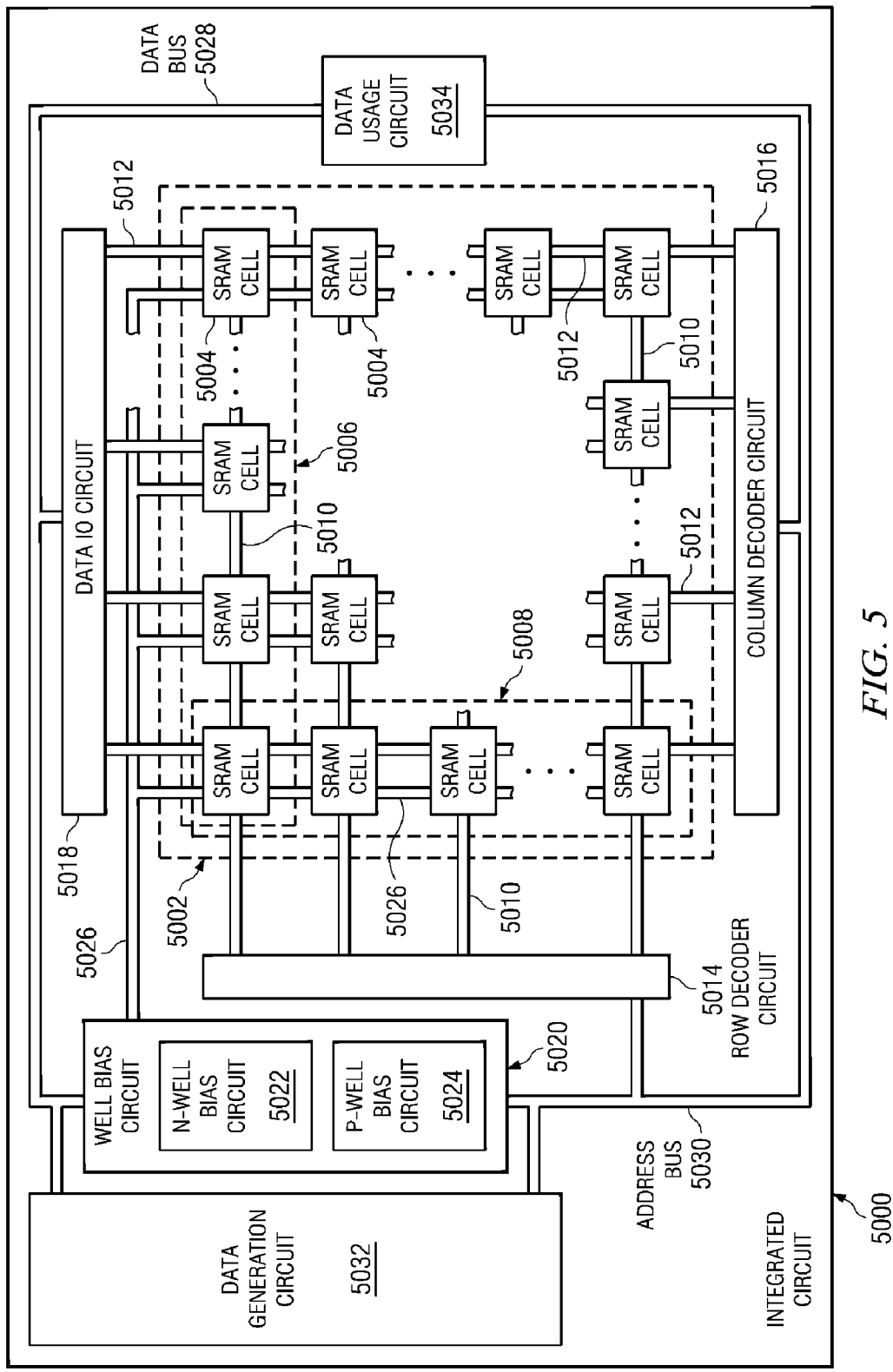
FIG. 5 depicts an integrated circuit containing an SRAM cell array which includes SRAM cells formed according to an embodiment of the instant invention.

FIG. 5 is an integrated circuit (5000) containing an SRAM cell array (5002) which includes SRAM cells (5004) formed according to an embodiment of the instant invention. The SRAM cells (5004) are arranged in rows (5006) and columns (5008). Each word line bus (5010) is connected to SRAM cells (5004) in a row (5006). Each word line bus (5010) may include more than one word line. Each bit line bus (5012) is connected to SRAM cells (5004) in a column (5008). Each bit line bus (5012) may include one or more bit or bit-bar lines. A row decoder circuit (5014) applies appropriate biases to word lines in the word line buses (5010). A column decoder circuit (5016) applies appropriate biases to bit or bit-bar lines in the bit line buses (5012). A data input/output (IO) circuit (5018) reads data from the bit or bit-bar lines in the bit line buses (5012) during read operations and applies appropriate potentials to the bit or bit-bar lines in the bit line buses (5012) during single sided write operations. A well bias circuit (5020) contains an n-well bias circuit which applies biases to a well bias bus (5022) which is connected to n-wells in the SRAM cells (5004). The well bias circuit (5020) may also contain an optional p-well bias circuit capable of biasing p-wells in the SRAM cells (5004). Furthermore, the n-well bias circuit and optional p-well bias circuit may be capable of biasing wells in addressed SRAM cells independently of wells in half-addressed SRAM cells. The integrated circuit further includes a data bus (5024) which carries data bits between the SRAM cell array (5002) and circuits in the integrated circuit (5000), and an address bus (5026) which is used to select SRAM cells (5004) in the SRAM cell array (5002) for read and write operations. The address bus (5026) is connected to the row decoder circuit (5014), the column decoder circuit (5016) and the auxiliary driver transistor bias circuit (5020). The integrated circuit (5000) may also contain a data generation circuit (5028) which connects to the data bus (5024) and address bus (5026). The data generation circuit (5028) produces incoming data bits for storage in the SRAM cell array (5002). The data bus (5024) carries the incoming data bits from the data generation circuit (5028) to the SRAM cell array (5002). The integrated circuit (5000) may also contain a data usage circuit (5030) which connects to the data bus (5024) and address bus (5026). The data usage circuit (5030) uses outgoing data bits which were stored in the SRAM cell array (5002). The data bus (5024) carries the outgoing data bits from the SRAM cell array (5002) to the data usage circuit (5030).

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of writing a data bit value to an addressed SRAM cell and a half-addressed SRAM cell within an SRAM cell array of an integrated circuit, comprising:
    applying a positive voltage increment to an n-well of said addressed SRAM cell;
    applying a negative voltage increment to an n-well of said half-addressed SRAM cell;
    connecting a bit data line in said addressed SRAM cell to a bit-side write potential appropriate for said data bit value; and
    turning on a bit-side passgate transistor in said addressed SRAM cell
    wherein said writing said data bit value further includes the steps of forward biasing a p-well in said addressed SRAM cell and reverse biasing a p-well in said half-addressed SRAM cell; and further wherein said step of reading said data bit value further includes the steps of adjusting a bias of said p-well in said addressed SRAM cell so as to provide a desired balance between a read current and data stability in said addressed SRAM cell and reverse biasing said p-well in said half-addressed SRAM cell.

2. The process of claim 1, further including reading a data bit value from said addressed SRAM cell and said half-addressed SRAM cell, by a process further including the steps of:
    applying a negative voltage increment to said n-well in said addressed SRAM cell;
    applying a negative voltage increment to said n-well in said half-addressed SRAM cell; and
    turning on said bit-side passgate transistor in said addressed SRAM cell.

3. The process of claim 1, in which said step of writing a data bit value further includes a step of determining if said writing process was successful.

4. The process of claim 1, in which said step of reading a data value further includes the step of determining if said reading process was successful.

* * * * *